(12) United States Patent
Li et al.

(10) Patent No.: US 7,701,070 B1
(45) Date of Patent: Apr. 20, 2010

(54) INTEGRATED CIRCUIT AND METHOD OF IMPLEMENTING A CONTACT PAD IN AN INTEGRATED CIRCUIT

(75) Inventors: Richard C. Li, Cupertino, CA (US); Abu K. Eghan, San Jose, CA (US); Qi Lin, Cupertino, CA (US)

(73) Assignee: XILINX, Inc., San Jose, CA (US)

( * ) Notice: Subject to any disclaimer, the term of this patent is extended or adjusted under 35 U.S.C. 154(b) by 141 days.

(21) Appl. No.: 11/633,968

(22) Filed: Dec. 4, 2006

(51) Int. Cl.
*H01L 23/48* (2006.01)
*H01L 23/52* (2006.01)
*H01L 29/40* (2006.01)

(52) U.S. Cl. ............... 257/781; 257/784; 257/E23.145; 438/622

(58) Field of Classification Search ......... 257/781, 257/784, E23.145; 438/622
See application file for complete search history.

(56) References Cited

U.S. PATENT DOCUMENTS

| | | | | |
|---|---|---|---|---|
| 5,323,060 A * | 6/1994 | Fogal et al. | ........... | 257/777 |
| 6,522,021 B2 * | 2/2003 | Sakihama et al. | ........... | 257/784 |
| 6,900,541 B1 * | 5/2005 | Wang et al. | .......... | 257/758 |
| 7,005,369 B2 | 2/2006 | Gasner et al. | | |
| 7,071,575 B2 | 7/2006 | Wu et al. | | |
| 2006/0097406 A1 * | 5/2006 | Wu et al. | .......... | 257/784 |
| 2006/0180946 A1 * | 8/2006 | Chen | .......... | 257/786 |
| 2006/0289981 A1 * | 12/2006 | Nickerson et al. | ........ | 257/686 |

* cited by examiner

*Primary Examiner*—Phat X Cao
(74) *Attorney, Agent, or Firm*—John J. King (57) ABSTRACT

An integrated circuit device is described. In particular, the integrated circuit comprises a substrate comprising active devices; a plurality of metal layers formed over the substrate, the plurality of metal layers being separated by insulating layers; a plurality of vias enabling connections to the active devices of the substrate; a contact pad support structure defining an opening in a metal layer of the plurality of metal layers and being coupled to an interconnect line; and a contact pad formed over the contact pad support structure. A method of implementing a contact pad in an integrated circuit is also disclosed.

20 Claims, 8 Drawing Sheets

INTEGRATED CIRCUIT AND METHOD OF IMPLEMENTING A CONTACT PAD IN AN INTEGRATED CIRCUIT

FIELD OF THE INVENTION

The present invention relates generally to integrated circuits, and in particular, to a method of implementing a contact pad in an integrated circuit.

BACKGROUND OF THE INVENTION

In manufacturing semiconductor devices, it is imperative that the devices are free of defects at the time of production, and reliable throughout their use. When defects are found in completed devices, the percentage of usable devices decreases, and the profitability of the manufacturer suffers. More importantly, when a semiconductor device fails after it has been installed in a device, such a failure may cause the entire device to fail. That is, the failure of a single semiconductor device may render an entire consumer electronics device unusable. Accordingly, it is important that manufacturers of semiconductor devices minimize defects whenever possible.

One area where defects may occur is in the area of wire bonding. Wire bonds are used to connect a bond pad on one element of a device, such as a die, to a bond pad on another element, such as a substrate receiving the die. While integrated circuits may be manufactured using flip chip technology where balls on the bottom of the die are directly connected to contact pads on a substrate, integrated circuits manufactured using wire bonding is generally cheaper than integrated circuits using flip chip technology. Stress generated during the bonding process and stress from material contacting the bonded structures during assembly of the integrated circuit package tend to propagate to substructures under the bond pad. The stress may cause failure of the interconnects, and in some cases, may cause the substructure to fail through cracks.

One type of device which may implement wire bonds is a programmable logic device (PLD). A PLD is designed to be user-programmable so that users may implement logic designs of their choices. Since their introduction, the capabilities of PLDs have rapidly improved. The combination of rich feature sets with device programmability and re-programmability has made PLDs highly adaptive to design changes during and after product development and, consequently, useful in a large variety of applications. However, because of the possibility of defects resulting from the attachment of wire bonds to contact pads, active devices and interconnects are often not positioned in the areas under the contact pads in conventional circuits to avoid damage to active devices, and in particular, metal oxide semiconductor (MOS) devices. While active devices such as junction diodes or bipolar transistors which do not have a dielectric layer and a gate may be formed on the edge of the substrate, other active devices such as metal oxide semiconductor (MOS) devices are often not formed along the edge of the device. MOS devices may include, for example, metal oxide semiconductor field effect (MOSFET) transistors having a gate formed over a dielectric layer formed on the diffusion regions. That is, MOS devices comprise a dielectric layer over the substrate which, along with other elements such as a gate of a MOSFET, may be damaged during wire bonding. While structures may be provided which may protect the MOS structures below the contact pad, such structures fail to provide additional functionality, but rather inhibit interconnect paths and occupy area within the metal layers.

Accordingly, there is a need for an improved integrated circuit and method of implementing a contact pad on an integrated circuit.

SUMMARY OF THE INVENTION

An integrated circuit device is described. In particular, the integrated circuit comprises a substrate comprising active devices; a plurality of metal layers formed over the substrate, the plurality of metal layers being separated by insulating layers; a plurality of vias enabling connections to the active devices of the substrate; a contact pad support structure defining an opening in a metal layer of the plurality of metal layers and being coupled to an interconnect line; and a contact pad formed over the contact pad support structure. The contact pad support structure may comprise a ring, for example, and may be coupled to a power bus by way of a via. The contact pad may be positioned over MOS devices of the substrate, or may be coupled to an integrated circuit substrate by a wire bond.

According to an alternate embodiment, an integrated circuit device comprises a substrate having a plurality of active devices; a plurality of metal layers formed over the substrate, the plurality of metal layers being separated by insulating layers; a plurality of vias enabling connections to the active devices of the substrate; a plurality of contact pad support structures, each contact pad support structure defining an opening in a metal layer of the plurality of metal layers and being coupled to an interconnect line; and a plurality of contact pads over the plurality of support structures above a region of the substrate having MOS devices. The active devices may extend substantially across the substrate. According to one embodiment, the device may comprise a programmable logic device.

A method of forming contact pads in an integrated circuit is also described. The method comprises forming active devices in a substrate of the programmable logic device; forming a plurality of metal layers on the substrate, the plurality of metal layers being separated by insulating layers; forming a plurality of vias enabling connections to the active devices of the substrate; providing a contact pad support structure defining an opening in a metal layer of the plurality of metal layers and being coupled to an interconnect line; and positioning a contact pad over the contact pad support structure.

DETAILED DESCRIPTION OF THE DRAWINGS

Figure 1:
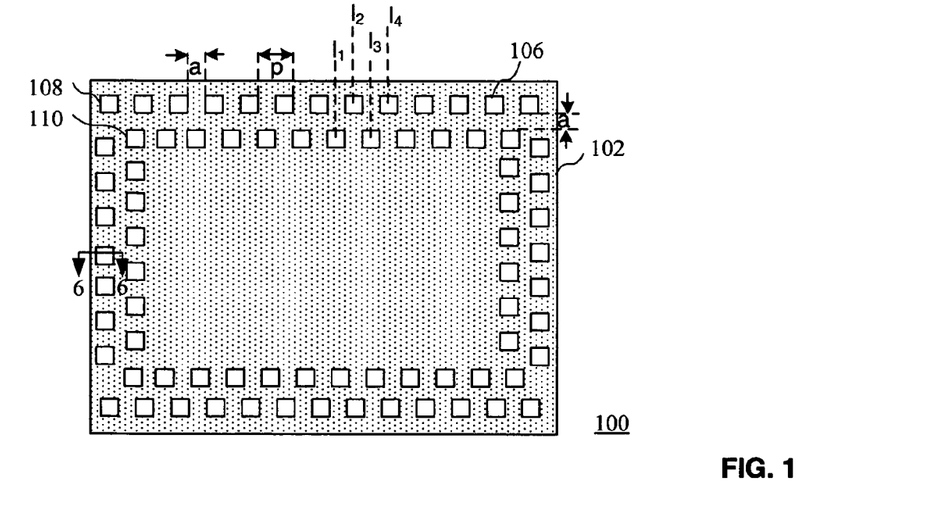
FIG. 1 is a top plan view of a die according to an embodiment of the present invention.

Turning first to FIG. 1, a top plan view of a die according to an embodiment of the present invention is shown. As shown in FIG. 1, contact pads are positioned over the shaded portion of the substrate 102 having active devices of the integrated circuit formed in the substrate. As can be seen, the active devices may occupy the entire substrate. The active devices may include any type of active device which may be damaged by wire bonds or probes, such as a MOS device. The structure of a contact pad support structure enabling the positioning of contact pad over active devices which may be damaged by a wire bond or probe will be described in more detail in reference to FIGS. 6-11. The die of FIG. 1 comprises contact pads 106 which are arranged in rows 108 and 110 along each end. While the contact pads may be positioned at any location on the die, the contact pads are preferably positioned near the edges as shown to enable wire bonding to the contact pads. Preferably, the rows of contact pads may be offset so that a wire of a wire bond is able to reach a contact pad without making contact to another wire, as shown for example by the dashed lines $I_1$-$I_4$. Rows may be offset to increase in plane wire clearance in low profile package implementations. According to one embodiment of the invention, the pitch "p" of the contact pads may be 60 micrometers (μm), while the space "a" between the contact pads may be 4 μm. However, other dimensions may also be used. Although two rows of contact pads are shown on each edge of the die, additional rows may be used. Accordingly, not only is the overall size of the die smaller because the portion of the substrate comprising active devices may extend to the ends of the substrate, but the contact pads may be located at any position of the die. The ability to add pads anywhere on the die allows the use of generous pad sizes, thereby substantially improving assembly yield. Using prevailing tighter pitches with this arrangement allows increased interconnect density for a given die size. As the integrated circuit technology continues to advance and the size of elements, such as transistors, formed in the substrate continues to decrease, the overall area of the die available for making contacts will also continue to shrink. Accordingly, the use of the multiple rows of contact pads on an edge of the die as shown in FIG. 1 will become increasingly beneficial.

Figure 2:
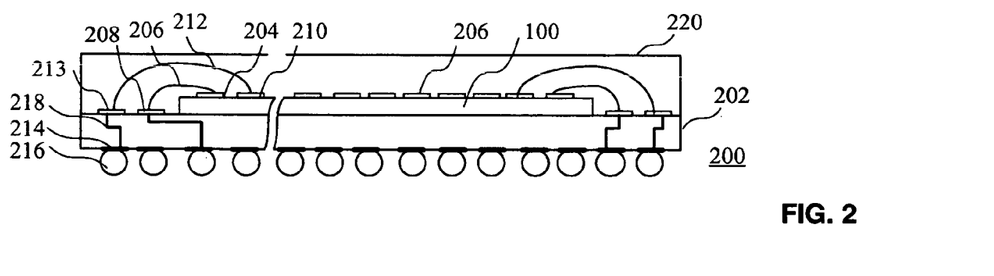
FIG. 2 is a side elevation view of an integrated circuit incorporating the die of FIG. 1 according to an embodiment of the present invention.

Turning now to FIG. 2, a side elevation view of an integrated circuit 200 incorporating the die of FIG. 1 according to an embodiment of the present invention is shown. In particular, a substrate 202 comprises a plurality of contact pads coupled to receive wire bonds from the contact pads 106 of the die 100. As shown in FIG. 2, a contact pad 204 in one row of a plurality of rows of contact pads is coupled by a wire bond 206 to a corresponding contact pad 208 of the substrate 202. A contact pad 210 of another row of the plurality of rows of contact pads is coupled by a wire bond 212 to a corresponding contact pad 213. While the contact pads in the first and second rows may be offset as shown in FIG. 1, the wire bonds may be formed as shown in FIG. 2, where an outer contact of the die 100 is wire bonded to an inner contact pad of the substrate. The wire bond 212 from the contact pad of the inner row die is bonded to a contact pad of the outer row of the substrate, enabling the wire bond 212 to be formed over the wire bond 206. The contact pads receiving the wire bond on the surface of the substrate 202 are coupled to contact pads which are used to make connection to a finished integrated circuit package. For example, in the BGA package shown in the embodiment of FIG. 2, a BGA ball contact pad 214 coupled to a solder ball 216 is coupled to the corresponding contact pad 213 by way of a connection 218. An encapsulant 220 encapsulates the die 100 and all the wires attached thereon. The encapsulant may be a lid or a type of molded material as is well known in art. Although a BGA structure is shown by way of example in FIG. 2, other integrated circuit packages may be employed.

Figure 3:
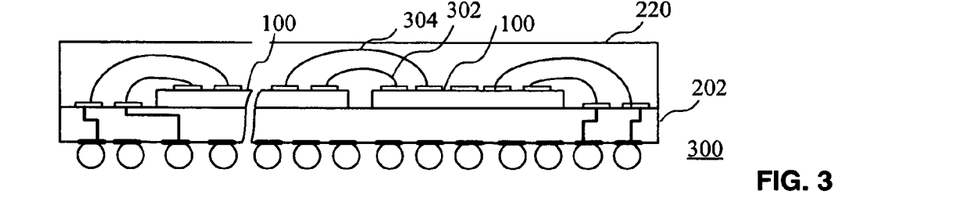
FIG. 3 is a side elevation view of an integrated circuit incorporating the die of FIG. 1 according to an alternate embodiment of the present invention.
Figure 4:
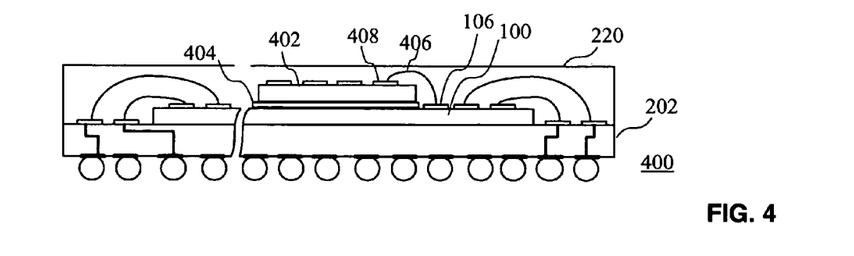
FIG. 4 is a side elevation view of an integrated circuit incorporating the die of FIG. 1 according to another alternate embodiment of the present invention.
Figure 5:
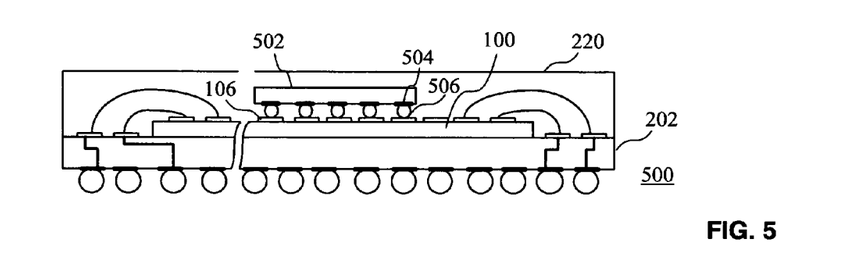
FIG. 5 is a side elevation view of an integrated circuit incorporating the die of FIG. 1 according to a further alternate embodiment of the present invention.

Turning now to FIGS. 3-5, alternate embodiments show implementations of the die of FIG. 1. As shown in the FIG. 3, two die 100 are employed on the substrate 202. One benefit of the embodiment of FIG. 3 is that the contact pads of the die 100 enable the wire bonding from contact pads of one die to another die, as shown for example with wire bonds 302 and 304, without damage to the device. As shown in FIG. 4, an additional die 402 also having contact pads and contact pad support structures may be attached to the die 100 over an insulating adhesive material 404. A wire bond 406 may then be made from a contact 408 of the additional die to a contact 106 of the die 100. Accordingly, in addition to reducing the size of the die 100, the circuit of FIG. 4 also enables reducing the size of the additional die 402. Alternatively, a flip chip 502 may be attached to the die 100, as shown in FIG. 5. In particular, a contact pad 504 enables a connection by a solder ball 506 to a contact 106.

Figure 6:
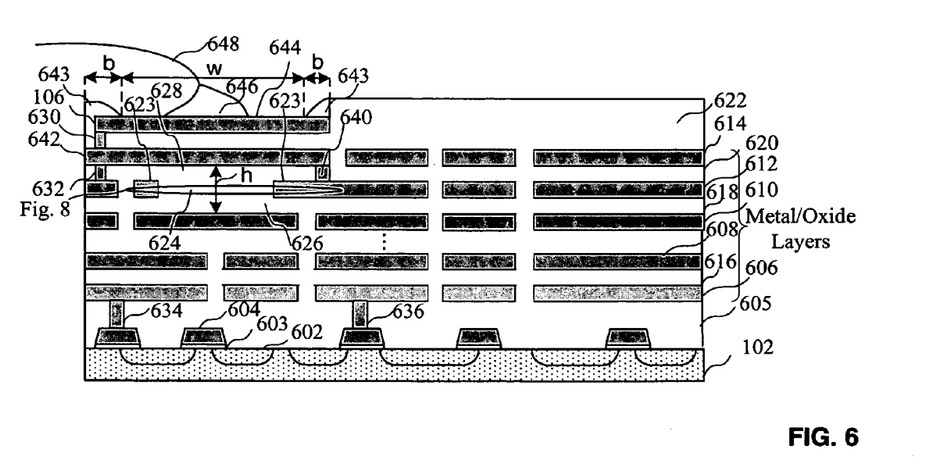
FIG. 6 is a cross-sectional view of the die of FIG. 1 taken at lines 6-6 according to an embodiment of the present invention.

Turning now to FIG. 6, a cross-sectional view of the die of FIG. 1 taken at lines 6-6 according to an embodiment of the present invention is shown. As shown in the circuit of FIG. 6, the region of the substrate comprising active devices which may be damaged by a wire bond or a probe substantially occupies the entire substrate, subject to tolerances for forming wells or other diffusion or implant regions of the active devices. A portion of a diffusion region 602 is covered by a dielectric layer 603 which is etched to form a gate 604 of a polysilicon layer positioned on the dielectric layer. Alternating metal and dielectric layers above a dielectric layer 605 enable the formation of interconnect lines between a node of a circuit and an element of the substrate, such as a gate formed on the diffusion regions of the substrate. In particular, metal layers 606-614 are separated by corresponding dielectric layers 616-622 to enable the formation of the interconnects using vias. The metal layers and vias may comprise copper, aluminum, or some other suitable conductive material, while the dielectric may comprise fluorinated spin-on glass (FSG), or some other suitable material having a low dielectric constant. The contact pad 106 may be aluminum, or some other suitable conducting material. The number of metal layers required to implement the necessary interconnects of the integrated circuit may vary depending upon the complexity of the circuit.

As will be described in more detail in reference to FIGS. 7-11, a contact pad support structure 623 is formed in a metal layer beneath the contact pad 106 to prevent damage to layers below the contact pad when a wire bond is formed or a probe is used on the pad for diagnostic and functions. The contact pad support structure 623 is formed in the second metal layer below the contact pad, metal layer 610, and comprises a region of dielectric material 624 in an opening in the metal layer between a region of the dielectric material 626 of dielectric layer 618 and a region of dielectric material 628 of dielectric layer 620. However, the contact pad support structure 623 may be formed in a different metal layer. As shown in FIG. 6, a number of vias are formed between metal layers of the integrated circuit, including vias 630, 632 and 634 formed below the contact pad, as well as a via 636 which is not below the contact pad. As can be seen, the vias 630 and 632 are formed above the third metal layer 610 below the contact pad. According to one aspect of the invention, a via 640 may be employed to couple the contact pad support structure to a power bus, ground bus or signal line, such as the metal portion 642 of the metal layer 614. A bonding region 644 defined between an etched area of dielectric 643 is formed on the contact pad 106 and coupled to receive a wire bond ball 646 and corresponding wire 648. The width "b" of the dielectric layer forming the bonding region may be 1 μm, while the width "w" of the bonding region of the contact pad may be 48 μm, for example.

Figure 7A:
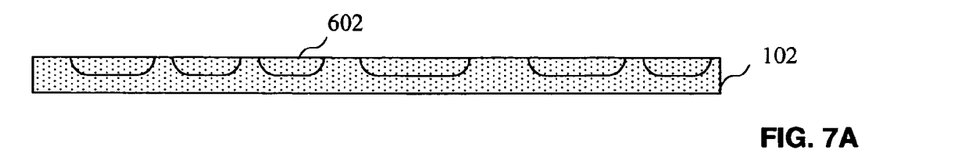
FIGS. 7A-7I include a series of process steps showing the formation of the die of FIG. 6 according to an embodiment of the present invention.
Figure 7B:
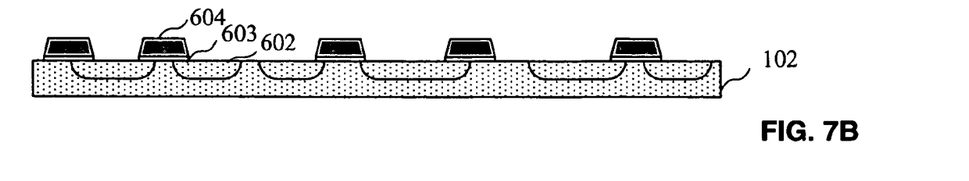
Figure 7C:
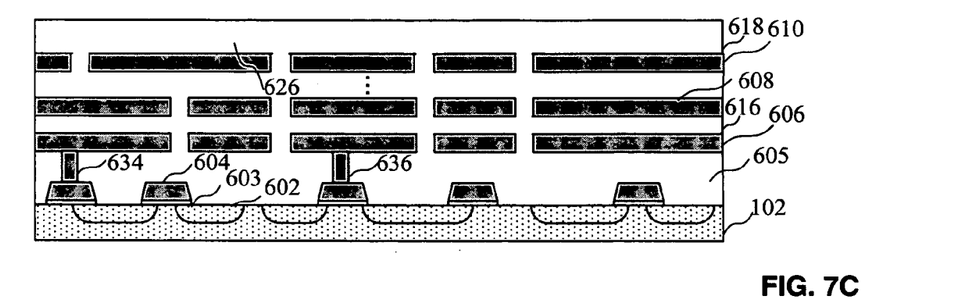
Figure 7D:
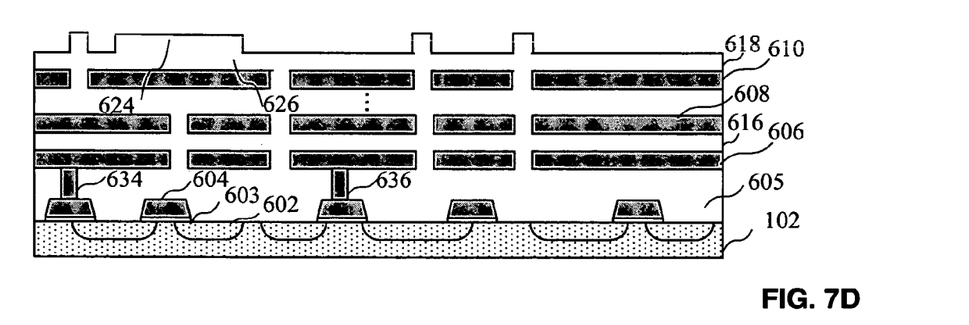
Figure 7E:
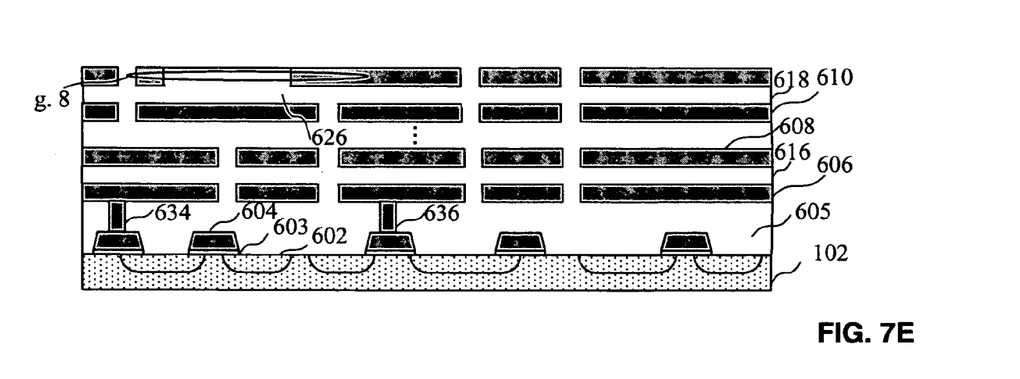

Turning now to FIGS. 7A-7I, a series of process steps shows the formation of the die of FIG. 6 according to an embodiment of the present invention. After the circuit elements are formed in the active area of the substrate, such as by diffusion or ion implantation, as shown in FIG. 7A, other elements, such as a polysilicon gate 604 are formed. The polysilicon gate may be formed over a dielectric layer 603 as shown in FIG. 7B. Alternating layers of metal and dielectric are then formed to create the interconnect lines of the circuit, as shown in FIG. 7C, where a dielectric layer 618 is shown before etching. The dielectric layer is then etched as shown in FIG. 7D to enable the formation of the opening in the metal layer in the area of the contact pad support structure. In particular, the region of dielectric material 624 is formed by the etching process. The metal layer 612 is then formed on the dielectric layer 618, as shown in FIG. 7E. Various embodiments of the contact pad support structure will be shown and described in more detail in reference to the top plan view drawings of FIGS. 8-11.

Figure 7F:
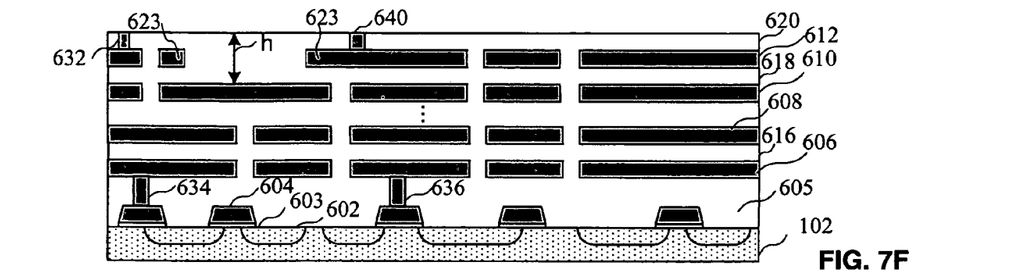
Figure 7G:
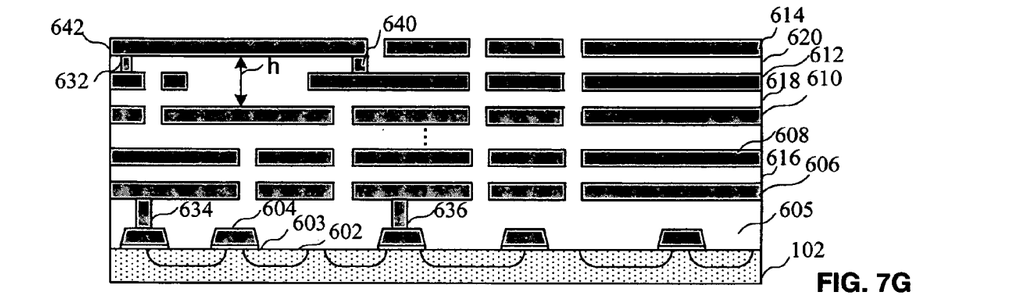
Figure 7H:
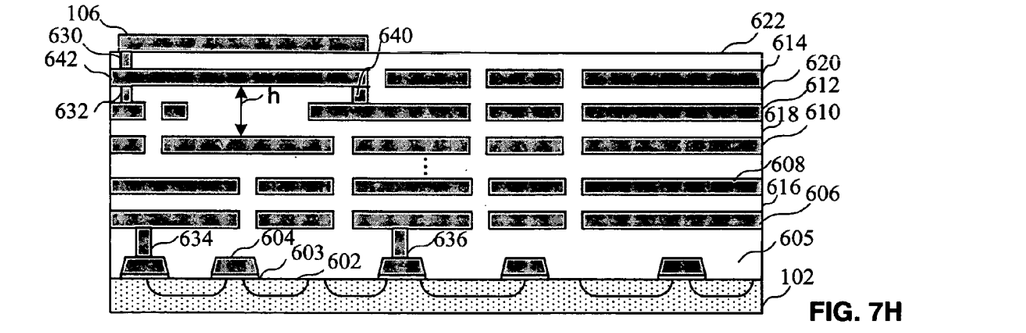
Figure 7I:
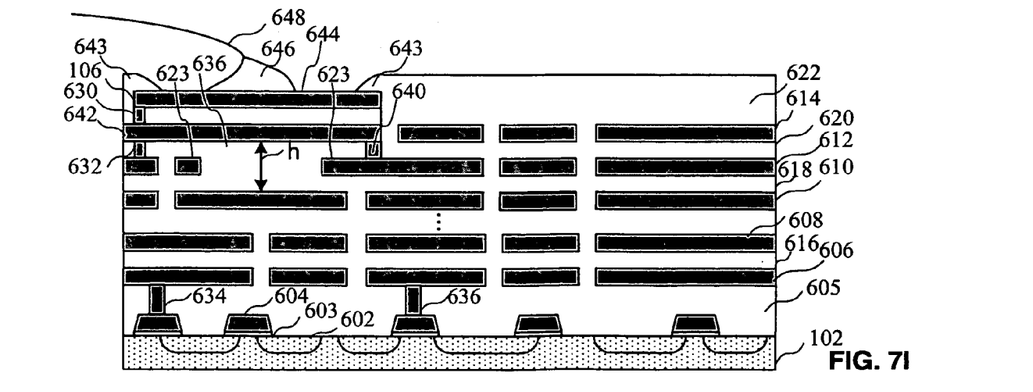

The dielectric layer 620 over the metal layer 612 is then formed and etched as shown in FIG. 7F to enable the formation of vias. In particular, the via 640 is formed to enable the connection of the contact pad support structure to another metal layer, such as the power bus for example. The metal layer 614 is then formed over the dielectric layer 620 as shown in FIG. 7G, enabling the connection of the metal portion 642 comprising the power bus to contact pad support structure 623 by way of the via 640. After the dielectric layer 622 is formed over the metal layer 614 and etched as necessary, the contact pad 106 is formed as shown in FIG. 7H. As also shown in FIG. 7H, the height "h" between the portion 642 of the metal layer 614 below the contact pad and the next metal layer 610 is increased, creating a uniformity of the dielectric material below the contact pad, and therefore, reducing the risk of damage during wire bonding. As will be described in more detail in reference to FIGS. 8-11, the contact pad support structure defines an opening in the metal layer and maintains the integrity of the dielectric material. Finally, the wire bond comprising the wire bond ball 646 and the corresponding wire 648 is formed between the dielectric portion 643 of the dielectric 622. Note that in some embodiments it may be possible to change the height of the pad support structure and the corresponding thickness of the dielectric material below the contact pad by using additional metal/oxide layers with corresponding vias. Such variations will be apparent to those of ordinary skill in the art.

Figure 8:
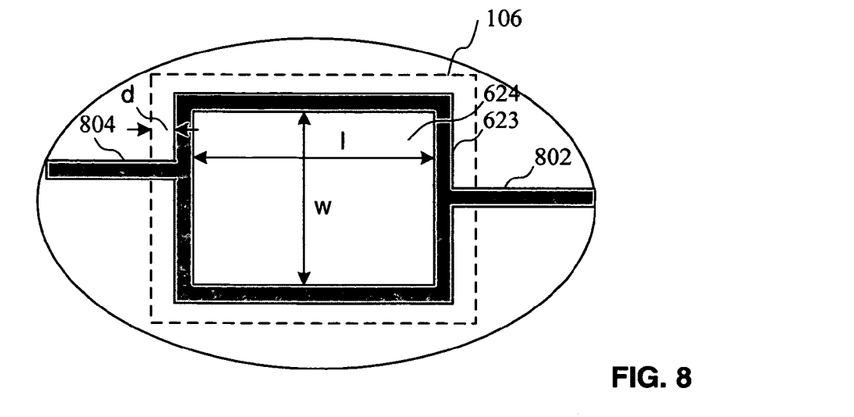
FIG. 8 is a top plan view of a portion of metal layer 612 of FIG. 6 according to an embodiment of the present invention.

Turning now to FIGS. 8-11, top plan views of a portion of metal layer 612 of FIG. 6 according to various embodiments of the present invention are shown. As shown in FIG. 8, the contact pad support structure 623 comprises a ring having an opening 624 filled with the dielectric material. The ring may extend to interconnect lines 802 and 804. The interconnect line 802 may enable the connection of the ring to a power bus, ground bus or signal line by way of the via 640 as described above. The use of interconnect lines coupled to the contact support structure enables improved routing of power, ground or signal lines. The ring is generally formed within the region occupied by the contact pad 106, shown in dashed lines. The outer edge of the ring may be within the edge of the contact pad by a distance 'd,' or may extend up to the edge of the contact pad or beyond the edge of the contact pad. The area of opening in the metal layer defining the ring is defined by dimensions 'l' and 'w.' The inner edge of the ring defined by the dimensions "l" and "w" may also extend beyond the region occupied by the contact pad shown in dashed lines such that the opening 624 is larger than the contact pad. That is, the dashed line representing the area representing the contact pad would be within the opening 624. For a square contact pad, for example, the dimensions 'l' and 'w' may be the same. The dimensions "d," "l" and "w" are selected to provide the best support for the dielectric material and may depend upon the dielectric material or other factors.

Figure 9:
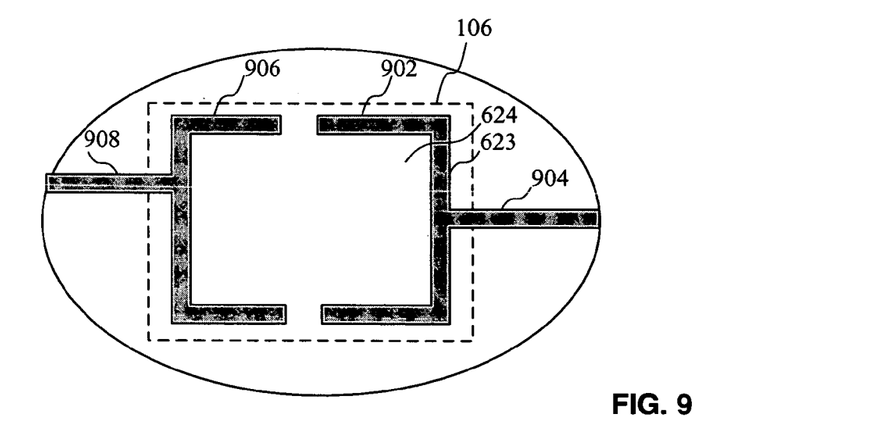
FIG. 9 is a top plan view of a portion of metal layer 612 of FIG. 6 according to an alternate embodiment of the present invention.
Figure 10:
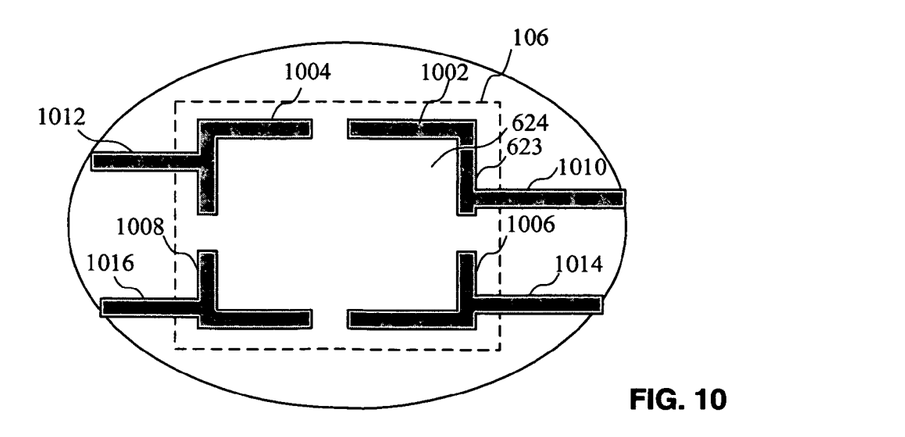
FIG. 10 is a top plan view of a portion of metal layer 612 of FIG. 6 according to another embodiment of the present invention.
Figure 11:
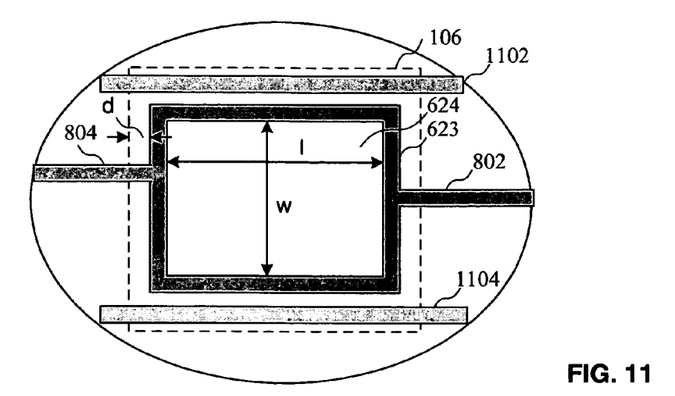
FIG. 11 is a top plan view of a portion of metal layer 612 of FIG. 6 according to another embodiment of the present invention.

The contact pad support structure may also comprise various portions to define the opening in the metal layer which creates the additional thickness of the dielectric material and supports the dielectric material. For example, as shown in FIG. 9, the contact pad support structure comprises a first portion 902 coupled to an interconnect line 904 which may enable the connection of the contact pad support structure to the power bus, for example, by way of the via 640, and a second portion 906 coupled to an interconnect line 908. In the embodiment of FIG. 10, four portions 1002-1008 are employed. Each of the four portions 1002-1008 may be coupled to interconnect lines 1010-1016, respectively, where portion 1002 is coupled to a line 1010 which enables the connection of the contact pad support structure to the power bus by way of the via 640. In the embodiments of FIGS. 9 and 10, each portion may be coupled to a different electrical potential. For example, the first portion 902 may be coupled to a first electrical potential by way of an interconnect line 904, while the second portion 906 may be coupled to a second electrical potential by way of a second interconnect line 908. Accordingly, in addition to providing the structural functionality to the circuit, the contact pad support structure may also provide electrical functionality and improve the routing of signal within the device. Finally, as shown in the embodiment of FIG. 11, the dimensions of "d", "l" and "w" may be made such that interconnect lines 1102 and 1104 may be positioned below the contact pad 106. The use of interconnect lines 1102 and 1104 further improve the functionality of a device having contact pad support structures as described above. Interconnect lines may be similarly positioned under the contact pads in the embodiments of FIGS. 8-10.

While the contact pad support structure may be employed in any type of integrated circuit, it finds particular application in PLDs, where reduction in size of the die implementing the PLD is important. One type of PLD is the Complex Programmable Logic Device (CPLD). A CPLD includes two or more "function blocks" connected together and to input/output (I/O) resources by an interconnect switch matrix. Each function block of the CPLD includes a two-level AND/OR structure similar to that used in a Programmable Logic Array (PLA) or a Programmable Array Logic (PAL) device. Another type of PLD is a field programmable gate array (FPGA). In a typical FPGA, an array of configurable logic blocks (CLBs) is coupled to programmable input/output blocks (IOBs). The CLBs and IOBs are interconnected by a hierarchy of programmable routing resources. These CLBs, IOBs, and programmable routing resources are customized by loading a configuration bitstream, typically from off-chip memory, into configuration memory cells, of the FPGA. For both of these types of programmable logic devices, the functionality of the device is controlled by configuration data bits of a configuration bitstream provided to the device for that purpose. The configuration data bits may be stored in volatile memory (e.g., static memory cells, as in FPGAs and some CPLDs), in non-volatile memory (e.g., flash memory, as in some CPLDs), or in any other type of memory cell. An FPGA structure implementing the contact pad support structure described above will be described in more detail in reference to FIGS. 12 and 13.

Figure 12:
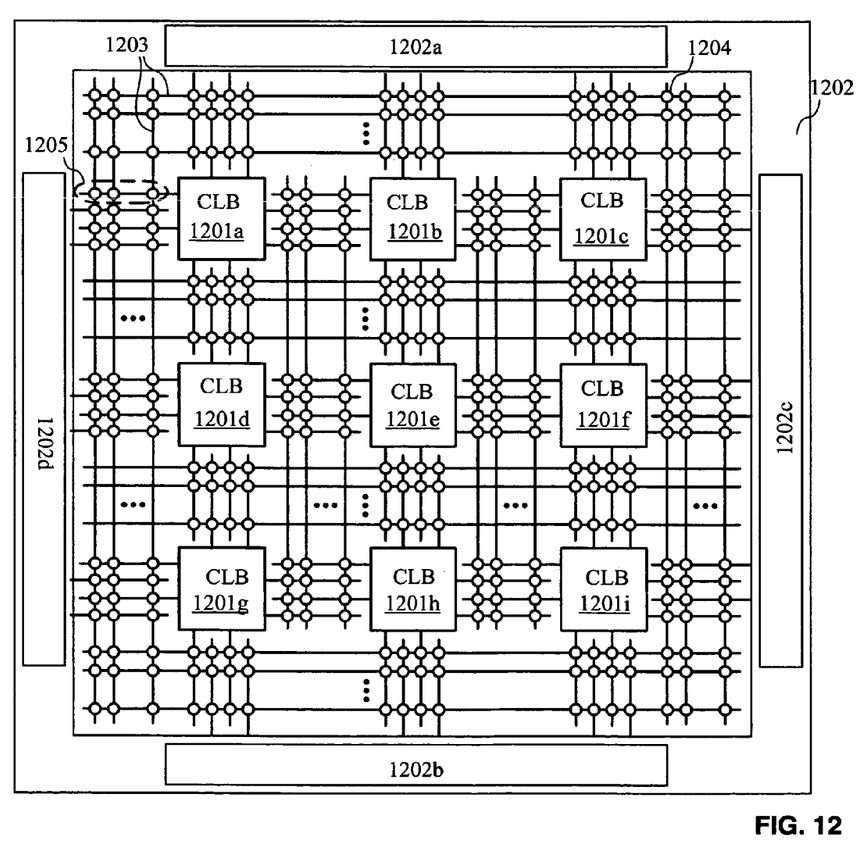
FIG. 12 is block diagram of a field programmable gate array having metal layers implementing the structure of FIG. 6 according to an embodiment of the present invention.

Turning now to FIG. 12, an FPGA having metal layers implementing the structure of FIG. 6 according to an embodiment of the present invention is shown. The FPGA of FIG. 12 includes an array of configurable logic blocks (CLBs 1201a-1201i) and programmable input/output I/O blocks (1202a-d) of an I/O region 1202, for example. The contact pads for the integrated circuit employing the circuits of FIG. 12 may be positioned over the I/O blocks of the I/O regions 1202. The CLBs and I/O blocks are interconnected by a programmable interconnect structure that includes a large number of interconnect lines 1203 interconnected by programmable interconnect points (PIPs) 1204, shown as small circles in FIG. 12. PIPs are often coupled into groups (e.g., group 1205) that implement multiplexer circuits selecting one of several interconnect lines to provide a signal to a destination interconnect line or logic block. Some FPGAs also include additional logic blocks with special purposes, such as multi-gigabit transceivers (MGTs), random access memory blocks (BRAMs), configuration and clocking logic, digital signal processing blocks (DSPs), and other programmable logic such as digital clock managers, analog-to-digital converters, system monitoring logic, and so forth. Some FPGAs also include dedicated processor blocks, a clock management block, and other intellectual property (IP) cores such as Universal Serial Bus (USB), Controller Area Network (CAN), analog to digital conversion (ADC), Ethernet, Mobile Industry. Processor Interface (MIPI), AMBA bus, etc. Finally, a CLB may include a configurable logic element that may be programmed to implement user logic, as will be described in more detail in reference to FIG. 13. Note that FIG. 12 is intended to illustrate only an exemplary FPGA architecture. The circuits and methods of the present invention may be implemented in any device, including any type of integrated circuit having programmable logic.

Figure 13:
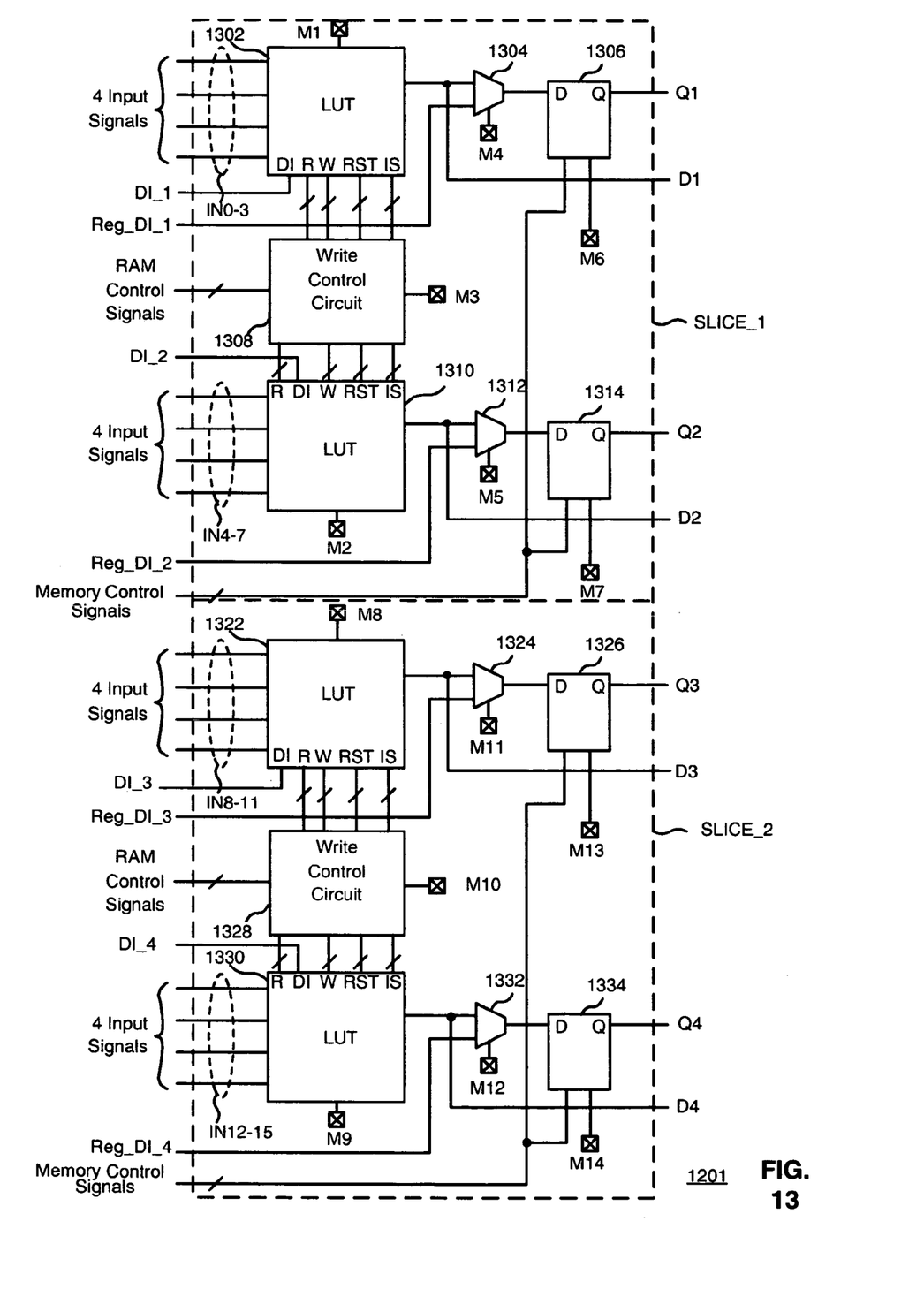
FIG. 13 is block diagram of a configurable logic element of the field programmable gate array of FIG. 12 according to an embodiment of the present invention.

Turning now to FIG. 13, a configurable logic element of the CLB of FIG. 12 is shown. In particular, the configurable logic element shown comprises two similar slices, where each slice comprises a pair of function generators. However, the configurable logic element may comprise more slices, such as four slices, for example. Each function generator may function in any of several modes depending upon the configuration data in the configuration memory elements M1-M14. When in RAM mode, input data is supplied by input terminals DI_1 and DI_2 to the data input (DI) terminal of the associated function generator. Each function generator, which may comprise a lookup table, provides an output signal to an associated multiplexer, which selects between the output signal of the function generator and an associated register direct input signal Reg_DI_1 or Reg_DI_2 from the programmable interconnect element. Thus, each function generator may be optionally bypassed. When in a look-up table mode, each function generator implemented as a look-up table has four data input signals IN0-IN3. Slice 1 comprises a function generator implemented as a LUT 1302 coupled to a multiplexer 1304. In particular, the LUT 1302 receives 4 input signals which are decoded to generate an output D1 associated with data stored in the LUT at the address designated by the input signals. The multiplexer 1304 is adapted to receive the output of LUT 1302 and a registered value of Reg_DI_1. The output of the multiplexer 1304 is coupled to a register 1306 which generates an output Q1.

A Write Control Circuit 1308 is coupled to receive RAM control signals and generate signals to control the LUT 1302. In addition to a data input (DI) coupled to receive DI_1 and conventional read and write control signals coupled to a read enable input (R) and a write enable input (W), respectively, the LUT 1302 comprises a partial reset input (RST) for receiving a partial reset signal, and an initial state input (IS) for receiving an initial state signal. Such resetting of the memory elements enables resetting the LUT memory cells during a partial reconfiguration of a programmable logic device, including partial reconfiguration of a device during operation. One advantage of resetting LUT memory elements of a device during partial reconfiguration is that it is not necessary to cycle through the required clock cycles to set the correct data after the partial reconfiguration. Similarly, slice 1 comprises a function generator implemented as a LUT 1310 coupled to a multiplexer 1312. The LUT 1310 is adapted to receive input signals IN4-IN7, while the multiplexer 1312 is coupled to receive the output D2 of the LUT 1310 and the registered input value Reg_DI_2. The output of the multiplexer 1312 is coupled to a register 1314 which generates an output Q2. The write control circuit 1308 also generates a partial reset signal and an initial state signal for selectively resetting or setting one or more of the bits of the LUT 1310.

Similarly, slice 2 comprises a function generator implemented as a LUT 1322 coupled to a multiplexer 1324. The LUT 1322 is adapted to receive input signals IN8-IN11, while the multiplexer 1324 is coupled to receive the output of the LUT 1322 and a registered input value Reg_DI_3. The output of the multiplexer 1324 is coupled to a register 1326 which generates an output Q3. A Write Control Circuit 1328 is coupled to receive RAM control signals and generate signals to control the LUT 1322. In particular, input signals IN8-IN11 are decoded to generate an output D3 associated with data stored in the LUT at the address designated by the input signals. The LUT 1322 comprises a partial reset input (RST) for receiving a partial reset signal, and an initial state input (IS) for receiving an initial state signal. Similarly, slice 2 comprises a function generator implemented as a LUT 1330 coupled to a multiplexer 1332. The LUT 1330 is adapted to receive input signals IN12-IN15, while the multiplexer 1332 is coupled to receive the output D4 of the LUT 1330 and a registered input value Reg_DI_4. The output of the multiplexer 1332 is coupled to a register 1334 which generates an output Q4. The write control circuit 1328 also generates a partial reset signal and an initial state signal for selectively resetting or setting one or more of the bits of the LUT 1330.

Figure 14:
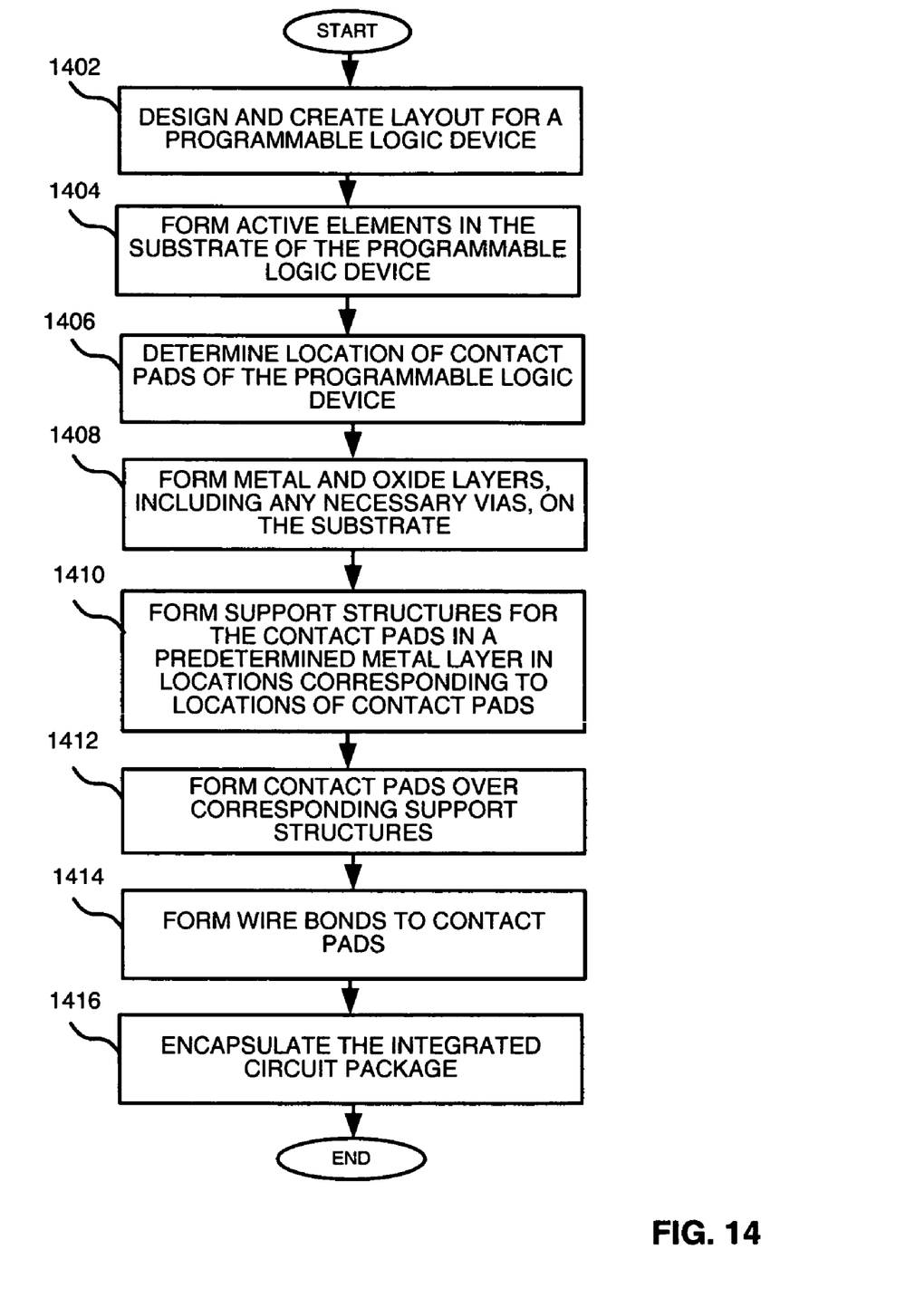
FIG. 14 is a flow chart showing a method of producing an integrated circuit having contact pads according to an embodiment the present invention.

Turning now to FIG. 14, a flow chart shows a method of producing an integrated circuit having contact pads according to an embodiment the present invention. In particular, a layout for a programmable logic device is designed and created at a step 1402. In designing a programmable logic device, the number and arrangement of metal layers for forming interconnect lines and vias are selected. Active devices are then formed in the substrate of the programmable logic device at a step 1404. Active devices which may be damaged by a wire bond are also formed in the substrate in regions which may be under the contact pads, as described above. The location of contact pads of the programmable logic device is determined at a step 1406. As described above, because the size of the die will decrease, it may be necessary to include rows of contact pads, as shown in FIG. 1. Metal and dielectric layers, including any necessary vias, are formed on the substrate, depending on the complexity of the programmable logic device, at a step 1408. Contact pad support structures for contact pads are formed in locations corresponding to locations of the contact pads at a step 1410. Contact pads are then formed over corresponding contact pad support structures at a step 1412. Wire bonds are formed on the contact pads at a step 1414. Finally, the die and substrate are encapsulated as an integrated circuit package at a step 1416. The method of FIG. 14 may employ any of the circuits or techniques described above in reference to FIGS. 1-13, or any other suitable circuits or techniques.

It may therefore be appreciated that the new and novel integrated circuit and method of implementing a contact pad in an integrated circuit has been described. It will be appreciated by those skilled in the art that numerous alternatives and equivalents will be seen to exist which incorporate the disclosed invention. As a result, the invention is not to be limited by the foregoing embodiments, but only by the following claims.

What is claimed is:

1. An integrated circuit device comprising:
    a substrate having active devices extending to an end of the substrate;
    a plurality of metal layers formed over the substrate, the plurality of metal layers being separated by insulating layers;
    a plurality of vias enabling connections from the plurality of metal layers to the active devices of the substrate;
    a contact pad support structure defining an opening in at least one metal layer of the plurality of metal layers and being coupled to an interconnect line, the contact pad support structure supporting insulating material comprising a plurality of insulating layers between a first metal layer above the at least one metal layer and a second metal layer below the at least one metal layer;
    an insulating layer on the first metal layer and extending continuously over the opening of the contact pad support structure;
    a contact pad formed on the end of the substrate having active devices and over the insulating layer on the first metal layer and the contact pad support structure and having an exposed portion for receiving a wire bond, the second metal layer extending continuously under the opening, wherein the contact pad support structure creates a uniform insulating layer under the exposed portion for receiving the wire bond and within the opening between the first metal layer and the second metal layer and wherein the insulating layer on the first metal layer extends continuously and had no vias over the opening of the contact pad support structure, and the plurality of insulating layers between the first metal layer and the second metal layer reduce the risk of damage to active devices of the substrate under the contact pad.

2. The device of claim 1 wherein the contact pad support structure is formed in a metal layer immediately below the first metal layer.

3. The device of claim 1 wherein the contact pad support structure comprises a ring.

4. The device of claim 1 wherein the contact pad support structure is coupled to one of a power bus, a ground bus, or a signal line by way of a via.

5. The device of claim 1 wherein the contact pad is coupled to an integrated circuit substrate by a wire bond.

6. The device of claim 1 wherein the active devices include at least one MOS device, and
    wherein the contact pad is positioned over the at least one MOS device.

7. The device of claim 1 wherein the substrate is a first substrate, the device further comprising a second substrate having a contact pad support structure, where a wire bond is formed from a first contact pad of the first substrate to a second contact pad of the second substrate.

8. An integrated circuit device comprising:
    a substrate having active devices extending to an end of the substrate;
    a plurality of metal layers formed over the substrate, the plurality of metal layers being separated by insulating layers;
    a plurality of vias enabling connections from the plurality of metal layers to the active devices of the substrate;
    a plurality of contact pad support structures, each contact pad support structure defining an opening in a metal layer of the plurality of metal layers and being coupled to an interconnect line, each contact pad support structure supporting insulating material comprising a plurality of insulating layers between a first metal layer above the metal layer having the opening and a second metal layer below the metal layer having the opening;
    an insulating layer on the first metal layer and extending continuously over the opening of each contact pad support structure of the plurality of contact pad support structures;
    a plurality of contact pads formed on the end of the substrate having active devices and over the first metal layer and the plurality of contact pad support structures above at least one region of the substrate having MOS devices, each contact pad having an exposed portion for receiving a wire bond, the second metal layer extending continuously under the opening, wherein each contact pad support structure creates a uniform insulating layer under the exposed portion for receiving a wire bond and within the opening between the first metal layer and the second metal layer and wherein the insulating layer on the first metal layer extends continuously and has no vias over the opening of each contact pad support structure, and the plurality of insulating layers between the first metal layer and the second metal layer reduce the risk of damage to the MOS devices of the at least one region of the substrate.

9. The device of claim 8 wherein the MOS devices extend substantially across the substrate.

10. The device of claim 8 wherein the substrate is a first substrate, the device further comprising a second substrate positioned on an insulating layer of the first substrate and having a contact pad support structure, wherein a wire bond is coupled from a first contact pad of the second substrate to a second contact pad of the substrate.

11. The device of claim 8 further comprising a second interconnect line beneath a contact pad.

12. The device of claim 8 wherein each contact pad support structure of the plurality of contact pad support structures comprises a ring.

13. The device of claim 8 wherein a contact pad support structure of the plurality of contact pad support structures is coupled to one of a power bus, a ground bus, or a signal line.

14. The device of claim 8 wherein the device comprises a programmable logic device.

15. A method of forming contact pads in an integrated circuit, the method comprising:
   forming active devices in a substrate of the integrated circuit, wherein the active devices extend to an end of the substrate;
   forming a plurality of metal layers over the substrate, the plurality of metal layers being separated by insulating layers;
   forming a plurality of vias to enable connections from the plurality of metal layers to the active devices of the substrate;
   providing a contact pad support structure defining an opening in a metal layer of the plurality of metal layers and being coupled to an integrated circuit line, the contact pad support structure supporting insulating material comprising a plurality of insulating layers between a first metal layer above the metal layer having the opening and a second metal layer below the metal layer having the opening;
   an insulating layer on the first metal layer and extending continuously over the opening of each contact pad support structure of the plurality of contact pad support structures; and
   positioning a contact pad over the contact pad support structure, wherein the contact pad is formed on the end of the substrate having active devices and over the first metal layer and the plurality of contact pad support structures above at least one region of the substrate having MOS devices, each contact pad having an exposed portion for receiving a wire bond, the second metal layer extending continuously under the opening, wherein each contact pad support structure creates a uniform insulating layer under the exposed portion for receiving a wire bond and within the opening between the first metal layer and the second metal layer and wherein the insulating layer on the first metal layer extends continuously and has no vias over the opening of each contact pad support structure, and the plurality of insulating layers between the first metal layer and the second metal layer reduce the risk of damage to the MOS devices of the at least one region of the substrate.

16. The method of claim 15 wherein providing a contact pad support structure in a metal layer comprises forming a contact pad support structure in a second metal layer under the contact pad.

17. The method of claim 16 wherein providing a contact pad support structure in a metal layer comprises forming a metal ring in a metal layer under the contact pad.

18. The method of claim 15 wherein forming active devices in the substrate comprises forming at least one MOS device in the substrate; and
   wherein positioning a contact pad over the contact pad support structure comprises positioning a contact pad over the at least one MOS device.

19. The method of claim 15 further comprising coupling the contact pad support structure to one of a power bus, a ground bus or a signal line.

20. The method of claim 15 further comprising forming a plurality of contact pads in a plurality of rows which are offset, wherein each contact pad is positioned over a contact pad support structure.

* * * * *